US008707573B2

(12) United States Patent
DeRoche et al.

(10) Patent No.: US 8,707,573 B2
(45) Date of Patent: Apr. 29, 2014

(54) LOW CLEARANCE MACHINED PART MATING SYSTEM

(71) Applicant: Sonnax Industries, Inc., Bellows Falls, VT (US)

(72) Inventors: William M. DeRoche, Westmoreland, NH (US); Garry J. Emge, Keene, NH (US)

(73) Assignee: Sonnax Industries, Inc., Belllows Falls, VT (US)

( * ) Notice: Subject to any disclaimer, the term of this patent is extended or adjusted under 35 U.S.C. 154(b) by 66 days.

(21) Appl. No.: 13/654,125

(22) Filed: Oct. 17, 2012

(65) Prior Publication Data
US 2013/0041596 A1 Feb. 14, 2013

Related U.S. Application Data

(62) Division of application No. 12/573,510, filed on Oct. 5, 2009, now Pat. No. 8,307,528.

(51) Int. Cl.
*G01B 7/34* (2006.01)
*G01B 5/00* (2006.01)
*H01L 21/66* (2006.01)

(52) U.S. Cl.
CPC ............. G01B 5/0002 (2013.01); H01L 22/20 (2013.01)
USPC .................................. 33/549; 33/813; 702/84

(58) Field of Classification Search
CPC ..... G10B 5/0002; G10B 5/0004; H01L 22/20
USPC ........................ 33/549, 551, 813, 819, 1 BB
See application file for complete search history.

(56) References Cited

U.S. PATENT DOCUMENTS

| 3,599,339 A | * | 8/1971 | Adamczyk ...................... 33/556 |
| 4,137,641 A | * | 2/1979 | Lauri .............................. 33/551 |
| 4,559,684 A | | 12/1985 | Pryor |
| 5,117,081 A | | 5/1992 | Bagdal |

(Continued)

FOREIGN PATENT DOCUMENTS

| EP | 1736278 B1 | 12/2008 |
| JP | 2005059102 | 3/2005 |

OTHER PUBLICATIONS

Schnitzler, Gerry, Honing: It's no lapping matter! Manufacturing Engineering; vol. 125 No. 3; pp. 56-64; Sep. 2000.

(Continued)

*Primary Examiner* — G. Bradley Bennett
(74) *Attorney, Agent, or Firm* — Downs Rachlin Martin PLLC

(57) ABSTRACT

A device, system, and method for generating low clearance slidably mated parts. In an exemplary embodiment, the system includes a measurement device having a non-contact micrometer capable of coincidentally indicating opposing edge data, rotational and linear air bearing slides, and a holding device. The non-contact micrometer allows for measurement of a plurality of parameters of a first part including the diameter and the difference between an edge of the first part and a reference point. The coincidental measurements are used to determine the size and geometric errors associated with the first part after suitable error elimination. In an exemplary system, a processing machine may be instructed by the measurement device to remove material from a second part so that the first part and the second part when mated together have a very low clearance tolerance level, e.g., as little as 0.00005 inches or less.

31 Claims, 7 Drawing Sheets

(56) References Cited

U.S. PATENT DOCUMENTS

| | | | |
|---|---|---|---|
| 5,755,025 A | | 5/1998 | Wirth et al. |
| 5,793,488 A | | 8/1998 | Kulawiec et al. |
| 5,917,726 A | | 6/1999 | Pryor |
| 5,940,302 A | | 8/1999 | Pryor |
| 6,138,055 A | | 10/2000 | Pryor |
| 6,415,191 B1 | | 7/2002 | Pryor |
| 6,591,497 B2 | | 7/2003 | Foster et al. |
| 6,988,314 B2 | | 1/2006 | Kobayakawa |
| 7,020,945 B2 | | 4/2006 | Aizaki |
| 7,225,519 B2 | | 6/2007 | Ichikawa et al. |
| 7,321,231 B2 * | | 1/2008 | Hayashida et al. ............ 33/813 |
| 7,328,125 B2 | | 2/2008 | Kawai et al. |
| 7,461,462 B2 | | 12/2008 | Bankestrom et al. |
| 7,657,339 B1 * | | 2/2010 | Retersdorf .................. 700/108 |
| 7,835,566 B2 * | | 11/2010 | Reich et al. ................... 382/145 |
| 7,917,244 B2 | | 3/2011 | Lin et al. |
| 2005/0021268 A1 * | | 1/2005 | Ono et al. ...................... 702/81 |
| 2008/0083127 A1 | | 4/2008 | McMurtry et al. |
| 2008/0147224 A1 * | | 6/2008 | Stirton et al. ................ 700/109 |
| 2011/0078885 A1 | | 4/2011 | Deroche |
| 2011/0128552 A1 * | | 6/2011 | Hadcock et al. ............. 356/496 |
| 2012/0105867 A1 | | 5/2012 | Komatsu |
| 2013/0174102 A1 * | | 7/2013 | Leu ................................ 716/52 |
| 2013/0245806 A1 * | | 9/2013 | Vaid et al. ...................... 702/81 |

OTHER PUBLICATIONS

W.Q. Zhao, Z. Xue, J.B. Tan and Z.B. Wang; SSEST: A new approach to higher accuracy cylindricity measuring instrument; ScienceDirect—International Journal of Machine Tools and Manufacturing; http://www.sciencedirect.com; Mar. 13, 2009.

Measurement of Out-Of-Roundness; The American Society of Mechanical Engineers; American National Standard; ANSI B89.3. 1—1972; reaffirmed 1979; pp. 1-27.

Related U.S Appl. No. 12/573,510, filed Oct. 5, 2009, and titled "Low Clearance Machined Part Mating System."

Office Action dated Mar. 19, 2012, in related U.S. Appl. No. 12/573,510, filed Oct. 5, 2009, and titled "Low Clearance Machined Part Mating System."

Response to Office Action dated Jun. 19, 2012, in related U.S. Appl. No. 12/573,510, filed Oct. 5, 2009, and titled "Low Clearance Machined Part Mating System."

Notice of Allowance dated Sep. 7, 2012, in related U.S. Appl. No. 12/573,510, filed Oct. 5, 2009, and titled "Low Clearance Machined Part Mating System."

* cited by examiner

LOW CLEARANCE MACHINED PART MATING SYSTEM

RELATED APPLICATION DATA

This application is a divisional of U.S. patent application Ser. No. 12/573,510, filed Oct. 5, 2009, and titled "Low Clearance Machined Part Mating System," now allowed, which is incorporated by reference herein in its entirety.

FIELD OF THE INVENTION

The present invention generally relates to the field of process machining for mated parts. In particular, the present invention is directed to an apparatus and methods for machining mating parts with low clearance requirements.

BACKGROUND

Manufacturing a set of mating parts, e.g., a sleeve with a bore and a spool valve that is slidably received in the bore, with very small clearances is challenging, particularly with respect to low-cost parts. Typically, in order to achieve very small clearances, a batch of one part, e.g., Part A, having a specified size and certain geometric tolerances, is made and then a batch of its corresponding part, e.g., Part B, having a specified size and certain geometric tolerances, is made. Under statistical theory, both parts A and B, individually, would exhibit a normal distribution around a mean, with an equal number of parts in the batch being higher and lower than the average part size. Thus, the parts could be "matched," i.e., a Part A could be matched with a Part B so that a very small clearance is achieved when assembled. While in theory this should result in little wasted material and involve only the physical process of identifying parts that should be joined together, for parts requiring a very low clearance this process is costly, inefficient, and is not always successful in achieving the desired clearance.

Manufacturers have sought more efficient and effective processes to achieve low clearance matching parts with limited success. Processors have attempted to specify the limits of geometric error on the two parts, thus establishing a maximum clearance amount. However, this methodology does not guarantee that the two parts will fit together, for example, if a Part A is at the upper limit of its geometric tolerance Part A may not fit together with a Part B at the lower end of its geometric tolerance. In addition, the parts may not fit together with a sufficiently low clearance. For example, if both Part A and Part B are at the low end of their respective geometric tolerance ranges, the clearance between the two parts may be higher than desired. Further, to ensure the desired clearance is achieved and to reduce assembly costs, Parts A and B must generally be manufactured to a high degree of precision to reduce the amount of variation, which increases manufacturing costs considerably. Given these constraints, previous manufacturing techniques that were capable of rapid throughput, i.e., less than 10 minute production times, were generally only able to achieve clearance tolerances of approximately 0.0011 inch.

The complexity and difficulty in manufacturing low clearance mated parts is exacerbated when attempting to create a set of mated parts when, for instance, Part A has a shape that includes two or more diameters, e.g., a first diameter extending for a certain portion of Part A and a second diameter extending for another portion of Part A. Multiple diameter parts pose challenges to manufacturers because Part A generally needs to mate with Part B at a low clearance at both diameters. However, the first diameter portion of Part A may end up at a certain tolerance and the second diameter portion of Part A may have a different tolerance. Thus, typically attempts to mate Part A with Part B require a compromise between the clearance at the first diameter portion and the clearance at the second diameter portion, resulting in a set of parts without an overall desired clearance value.

In addition, the aforementioned processes and others known in the art do not account for the challenges that arise when parts are treated to increase hardness. For example, hardcoat anodizing is a process that is generally used to increase the wear and corrosion resistance of the natural oxide layer on the surface of aluminum parts. A typical hardcoat anodizing application will add several thousandths of an inch to the surface of a part. However, the process typically does not provide a repeatable thickness from part to part and thus the tolerance range on a batch of parts achieved during the original machining process may be lost. While some manufacturers will machine the hardcoated part in order to return a part to within required tolerances, machining the hardcoated part is not only an extra, costly process, it can damage the hardcoat, thus limiting its effectiveness.

SUMMARY OF THE DISCLOSURE

The present disclosure describes a device, system and method for generating low clearance slidably mated parts. In an exemplary embodiment, a measurement device is described that measures edge data associated with a first part and processes the data to determine the size and the geometric errors associated with the first part. Additionally, a processing machine may be instructed by the measurement device to remove material from a second part so that the first part and the second part when mated together have a clearance tolerance of less than about 0.00005 inch.

In one exemplary embodiment, a measurement device includes a non-contact micrometer, an air bearing rotary table, an air bearing linear slide, and a holding device for holding the first part by its base on the air bearing rotary table. When inserting a first part into the holding device, the operator may generally induce tilt and position error relative to the non-contact micrometer. The non-contact micrometer transmits light across the first part to a receiver, thus illuminating the opposed edges associated with the first part. Two sets of edge data are stored by a control system, a first set representing the difference between the one edge of the first part and a reference point and the second set representing the distance between the two opposed edges. The first part is then rotated by the air bearing rotary table by a defined increment and the opposed edge data of the first part is captured again. Once edge data has been taken around the circumference of the first part, the air bearing linear slide moves the non-contact micrometer to another plane substantially orthogonal to the longitudinal axis of the first part. Edge data around the circumference is then taken at the new plane as before. The process is repeated for the remainder of the first part. The two sets of data are analyzed and from one or both of them the size and geometric errors associated with the first part are deduced. The size and geometric errors associated with the first part provide the dimensional information necessary to instruct the processing machine. An amount of as little as 0.00005 inch may be added to the dimensional information in order to provide the clearance necessary between the two parts.

In another exemplary embodiment, the processing machine includes plural lateral slides, a rotary table, a mini-lathe, a boring bar, a probe, and a centering chuck. The second part is placed into the centering chuck and the probe aids, intermittently, in centering the boring bar with the center of the second part. The minilathe and boring bar are moved horizontally by the plural lateral slides so that the boring bar is positioned to remove material from the second part based on the instructions from the measurement device. The end result is that the first part and the second part fit together with a clearance tolerance of less than about 0.00005 inch.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

DETAILED DESCRIPTION

Generally, low clearance machined part mating system 100 is suitable for the volume manufacture of mating parts that slidably engage one another at precise clearances. As will be discussed more fully below, an exemplary embodiment of low clearance machined part mating system 100 contemporaneously obtains measurements sufficient to calculate the size of and the geometric errors associated with a first part and then uses the calculations to create a second part. The resulting slidable clearance tolerance, i.e., proximity to the desired clearance, between the two parts may be consistently as little as 0.00005 inch, or even less in some cases, which may be considered a reduction of more than 20 times the clearance tolerance levels achievable using prior art techniques. Less precise clearance tolerances are also obtainable with system 100.

In one embodiment of the present disclosure, the process by which mating parts are made can be performed in less than about 9 minutes. However, more or less time may be taken depending on various circumstances, e.g., the precision required or the length of the part to be measured and machined. In another embodiment of the present disclosure, the process may be performed in less than about 2 minutes with the resulting clearance tolerance between the two mated parts being about 0.00005 inch.

Figure 1:
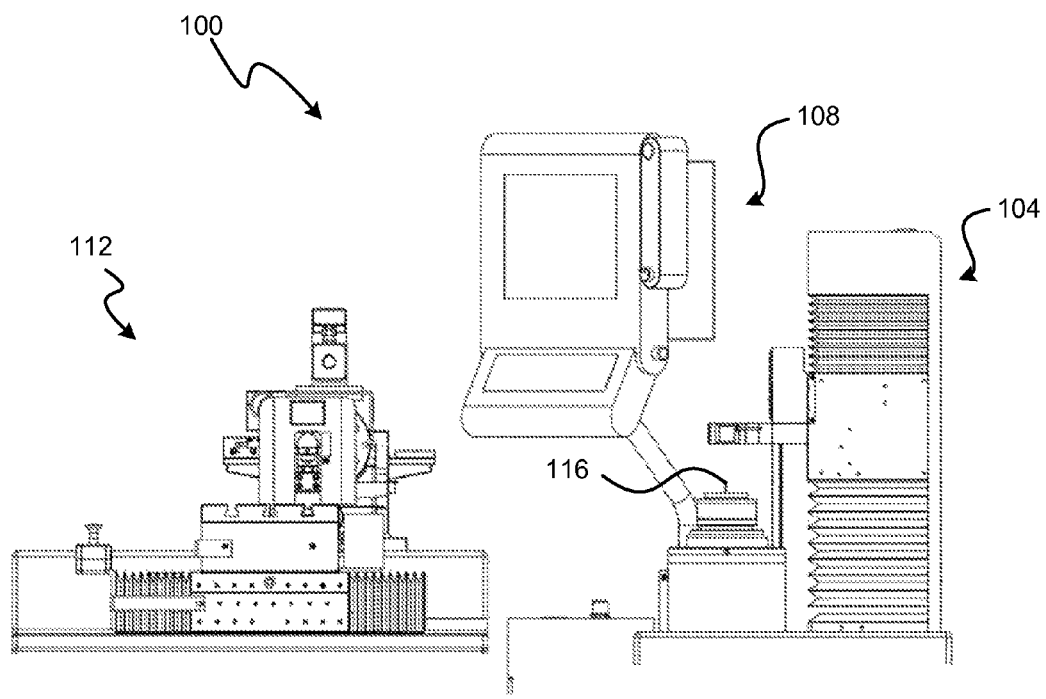
FIG. 1 is a side and partial perspective view of a low clearance machined part mating system according to an embodiment of the present invention.

Referring first to FIG. 1, there is illustrated an example of a low clearance machined part mating system 100 in accordance with an exemplary embodiment of the present invention. System 100 typically includes a measurement device 104, a control system 108, and a processing machine 112. Measurement device 104 is generally capable of measuring, contemporaneously and to a high degree of accuracy, a plurality of parameters of a first part 116. In an exemplary embodiment, first part 116 is generally cylindrical. However, as those skilled in the art will readily appreciate, first part 116 may embody many other shapes, configurations, and dimensions. In any event, measuring system 100 is not intended to be limited by the shape of first part 116 as described herein.

Generally, the parameters that measurement device 104 may measure include the radius from a theoretical reference point or geometric axis of a first part 116 and the diameter of the first part, but other parameters may be measured as well, as desired. Measurement device 104 may determine the parameters from edge data measurements taken in increments or continuously around the circumference of first part 116 and at selected planes spaced along the longitudinal axis of the first part. Control system 108 receives data determined by measurement device 104, processes the data as described below to determine the size of and geometric errors associated with first part 116, and then transforms these calculations into instructions for processing machine 112. Processing machine 112 is typically operated to remove material from a second part 120 so that first part 116 and the second part fit together with a very small clearance. Measurement device 104, control system 108, and processing machine 112 may communicate in an integrated fashion through a known data transfer mechanisms as may be devised by a person of ordinary skill in the art.

Figure 2:
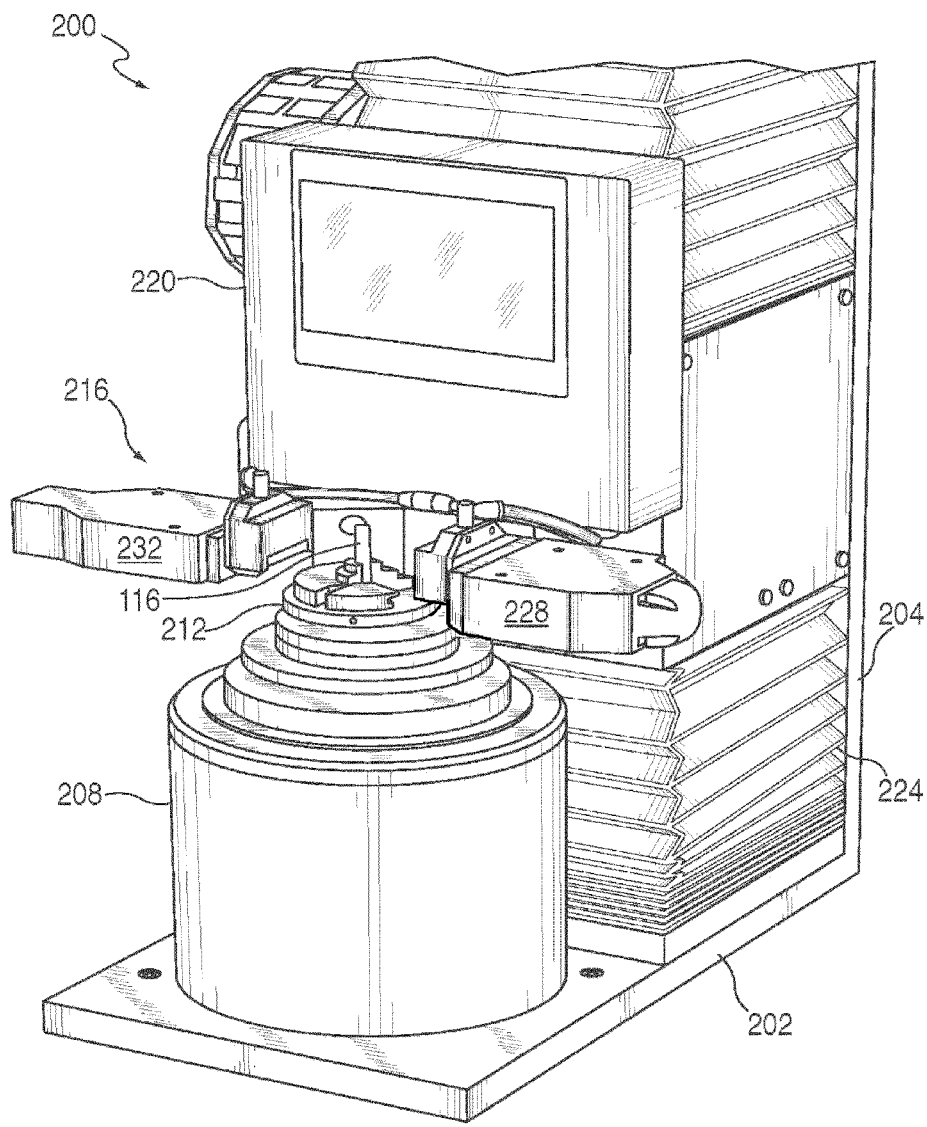
FIG. 2 is a perspective view of a measuring device according to an embodiment of the present invention.

FIG. 2 shows an exemplary measurement apparatus 200 suitable for use as, or as a part of, measurement device 104. Measurement apparatus 200 may include a base 202, movement devices, e.g., a linear slide 204 and a rotary table 208, a holding device, e.g., chuck 212, a non-contact micrometer 216, and a display device 220.

Base 202 is generally sized and dimensioned so as to provide support for the other components of measurement apparatus 200 and to minimize outside disturbances during the measurement operation. Base 202 may be made of materials that provide a stable measurement surface and is typically, but not necessarily, sized to accommodate the rest of measurement apparatus 200. In an exemplary embodiment, base 202 is natural solid granite base with bored holes and threaded inserts on steel welded frames and includes adjustable leveling feet. As an additional precaution against vibration, base 202 may include components for vibration isolation (not shown).

Linear slide 204 generally moves along the longitudinal axis of first part 116. Linear slide 204 may move in response to instructions from control system 108, on instructions from an external source such as a machine operator work station, or based on predefined inputs to measurement apparatus 200. In any event, linear slide 204 should be capable of very accurate linear movements, e.g., precision linear movement of twenty micro inches in six inches of travel, and should have a straightness of about 0.00003 inch in about one inch of linear travel or approximately 0.0002 inch in about eight inches of travel, although the precision and straightness of linear slide 204 will vary as a function of the intended application of low clearance machined part mating system 100. In an exemplary embodiment, linear slide 204 includes air bearing slide 224. Air bearing slide 224 may be of any number of constructions known in the art. For example, air bearing slide 224 may be a constrained box way design (not shown) that provides a fully preloaded air bearing carriage for high stiffness and resistance to off-set loading. In this example, high accuracy is generally achieved through tight form geometry control of the linear box rails and central placement of the linear drive which minimizes offset errors (not shown). Also included in a typical motorized air bearing slide 224 are brushless DC linear motors, high resolution encoders, and amplifiers, (not shown) although manual operation is also possible. Those skilled in the art will readily identify other suitable means, such as the use of hydrostatic linear slides or linear guide bearing slides, for accurately moving linear slide 204. In one implementation, linear slide 204 is a vertically positioned air bearing slide 224 that has a straightness of about 0.00003 inch in about one inch of linear travel or approximately 0.0002 inch in about eight inches of travel.

Linear slide 204 may be coupleable with non-contact micrometer 216. Non-contact micrometer 216 is generally capable of identifying the edge characteristics of first part 116 without physically touching the first part. Non-contact micrometer 216 may, in one embodiment, be designed to determine the edge characteristics of opposed points on first part 116. In an exemplary embodiment, non-contact micrometer 216 includes a light-emitting diode (LED)/charged-coupled device (CCD) optical micrometer, although as will be readily apparent to one skilled in the art, other non-contact micrometers are available such as laser micrometers or CCD laser micrometers. In any event, non-contact micrometer 216 is capable of measuring first part 116 at least at two places simultaneously. When non-contact micrometer 216 is implemented as a LED/CCD optical micrometer, the non-contact micrometer sends a plurality of light from LED emitter 228 across first part 116 to CCD receiver 232. In this configuration, the plurality of light emitted from LED emitter 228 may create a shadow of first part 116 on CCD receiver 232 that indicates two opposed edges of the first part.

Rotary table 208 is generally capable of rotating first part 116 around its longitudinal axis. Rotary table 208 may move incrementally or continuously in response to instructions from control system 108, on instructions from an external source such as a machine operator, or based on predefined inputs to measurement apparatus 200. In any event, rotary table 208 should be capable of accurate rotational movements. Rotary table 208 may be a rotary index table, a precision spin table, or other high precision apparatus with rotational capabilities. Although rotary table 208 may be manually or mechanically operated, a suitable rotary table 208 may include air bearings, DC motors, digital drives and rotary encoders (not shown), although other components known to those skilled in the art may be included and/or substituted. In an exemplary embodiment, rotary table 208 is a rotary air bearing table, however, those skilled in the art will readily identify other suitable means for accurately rotating first part 116 such as hydrostatic rotary tables or spindle bearing tables. In one implementation, rotary table 208 has a radial and axial accuracy of about five micro inches. In an alternative embodiment, rotary table 208 may be integrated with linear slide 204 and thus may be suitable for rotating first part 116 as well as moving the first part past non-contact micrometer 216.

Chuck 212, a type of holding device, may be coupled with rotary table 208 and is generally sized and dimensioned to hold first part 116. Generally, chuck 212 holds first part 116 in an offset and tilted position, i.e., with the longitudinal axis of first part 116 being non-parallel to the axis of rotation of rotary table 208 and with the center of first part 116 being offset from the center of rotary table 208, but as those skilled in the art will readily identify, chuck 212 may be designed to hold first part 116 in any suitable orientation.

Optionally, display device 220 may be coupled to vertical movement component 204. Generally, display device 220 is suitable for presenting the measurement results of non-contact micrometer 216 and the movements of rotary table 208 and linear slide 204. Display device 220 may also include a user interface that enables an operator to manipulate the components of measurement device 200. In certain embodiments, display device 220 may be integrated with control system 108.

In an alternative embodiment, measurement device 200 may be configured so that non-contact micrometer 216 rotates around a stationary first part 116 (not shown). In this embodiment, non-contact micrometer 216 may be coupled with rotary table 208. First part 116 may be held by chuck 212, which may be coupled to linear slide 204. Linear slide 204 may move first part 116 so as to place different planes that are substantially orthogonal to the longitudinal axis of first part 116 in view of non-contact micrometer 216 for measurement. In yet another alternative embodiment of measurement device 200, non-contact micrometer 216 may be coupled with both rotary table 208 and linear slide 204, or the rotary table and the linear slide may be integrated into the same device, so that the non-contact micrometer may move both rotationally and longitudinally about first part 116. A person of ordinary skill in the art will readily recognize that other various assemblies of the aforementioned components are possible that allow for contemporaneous measurement of opposed points around and along the longitudinal axis of first part 116.

In yet another embodiment, measurement device 200 may be configured so that several non-contact micrometers 216 may be assembled in a stacked arrangement, e.g., one on top of the other or side-by-side, to take multiple measurements along the longitudinal axis of first part 116 at the same time.

Figure 3:
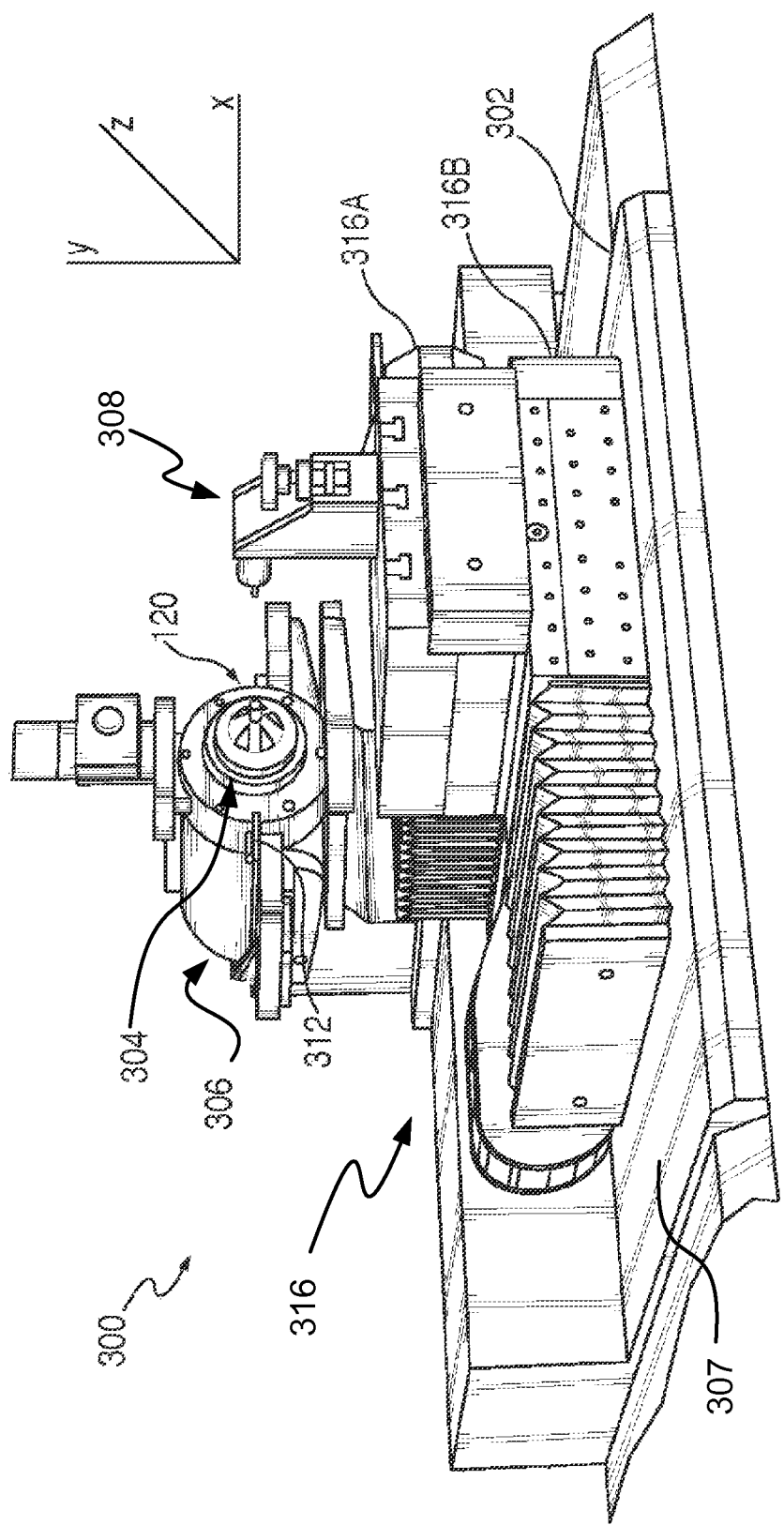
FIG. 3 is a perspective view of a processing machine according to an embodiment of the present invention.

FIG. 3 shows an exemplary processing apparatus 300 suitable for use as, or as a part of, processing machine 112. Processing apparatus 300 typically includes a base 302, a centering chuck 304, a spindle 306, a removal tool 308, a probe 312, and a plurality of lateral slides 316.

Processing apparatus 300 is suitable for facilitating removal of material from second part 120 so as to create the appropriate clearance between first part 116 and the second part. Those skilled in the art will readily appreciate that there are several types of processing apparatus 300 that may be suitable for removing material from second part 120. Typically, processing apparatus includes a removal tool 308, such as a drill bit for a drill or a honing stone for a honer that makes contact with second part 120, for removing material from second part 120. Examples of removal tool 308 include, but are not limited to, boring bars, drills, reamers, grinders, and honers. In an exemplary embodiment, processing apparatus 300 is a minilathe that uses a boring bar to remove material from second part 120.

Base 302 is generally sized and dimensioned so as to provide support for the other components of process apparatus 300 and to minimize outside disturbances during the processing of second part 120. Base 302 may be made of many materials recognized in the art as providing a stable processing environment and may be sized to accommodate processing apparatus 300. In an exemplary embodiment, base 302 is natural solid granite base with bored holes and threaded inserts on steel welded frames and includes adjustable leveling feet. As an additional precaution against vibration, base 302 may include components for vibration isolation.

Centering chuck 304 is generally a removable fixture on processing apparatus 300 that centers and constrains the movement of second part 120. Centering chuck 304 may be sized and dimensioned to hold second part 120 and provide sufficient restraint on the movement of second part 120 during the machining process. As movement during the machining process may induce deviations in second part 120, centering chuck 304 typically, although not necessary, is sized and dimensioned to hold only certain sizes of second part 120. For example, second parts 120 falling within a first size range may be held by a centering chuck 304 of a first size, and second parts 120 falling within a second size range may be held by a centering chuck 304 of a second size, and so on. In an exemplary embodiment, centering chuck 304 is a diaphragm chuck having a plurality of circumferentially spaced jaws mounted on a diaphragm.

Centering chuck 304 may be combined with spindle 306 so that second part 120 may be rotated during the machining process. Generally, spindle 306 is similar to rotary table 208 described above, although as shown in FIG. 3, spindle 306 is positioned so that the longitudinal axis of second part 120 is generally parallel to a major surface 307 of base 302. In an exemplary embodiment, spindle 306 is a rotary air bearing spindle having a radial and axial accuracy of about five micro inches.

Probe 312 generally serves to help center removal tool 308 with respect to the center of second part 120. Probe 312, in an exemplary embodiment, may contact removal tool 308 temporarily, at, for instance when removal tool 308 is a boring bar, the tip of the boring bar. Probe 312 is designed to communicate to control system 108 the position in two dimensional space of the tip of removal tool 308 (x and z directions, as shown on FIG. 3). Using a reference point and probe 312, removal tool 308 may be positioned in substantially the center of second part 120 in the x direction (as seen on FIG. 3). Probe 312 may then be removed from removal tool 308 so that it does not interfere with material removal from second part 120. In one embodiment, the location of removal tool 308 relative to the center of second part 120 is periodically checked using probe 312. In another exemplary embodiment, probe 312 is a linear variable differential transducer (LVDT) probe attached to or near spindle 306. As would be readily apparent to one skilled in the art other probe types or more than one probe may be used to center removal tool 308. For instance, in another embodiment of probe 312, the probe is designed and configured, with the use of one or more probes, to give the three dimensional location of removal tool 308.

Lateral slides 316 are generally coupled to base 302 and to removal tool 308. Lateral movement devices 316 are capable of very precise lateral movements and in general, may be of similar construction to linear slide 204. In an exemplary embodiment, lateral slides 316 are horizontally positioned air bearing slides 316A-B that have a straightness of approximately 0.00003 inch in about one inch of linear travel or approximately 0.0002 inch in about eight inches of travel. Air bearing slides 316A-B may also have, in another exemplary embodiment, a precision linear movement to a desired location of about twenty micro inches in six inches of travel. In this two air bearing slide embodiment, air bearing slide 316A may move removal tool 308 in one direction along a horizontal plane parallel to surface 307 of base 302 while air bearing slide 316B may move removal tool 308 in another direction along the same horizontal plane. When configured this way, air bearing slides 316A-B may selectively and precisely position removal tool 308 in a desired location in the horizontal plane so as to remove material from second part 120 per the instructions of control system 108. In another embodiment, a third air bearing slide (not shown), or similar structure, may be provided to allow for a third direction of movement.

It is to be noted that one or more of the aspects and embodiments described herein may be conveniently implemented using a machine (e.g., a computing device) programmed and communicating with other specialized components according to the teachings of the present specification, as will be apparent to those of ordinary skill in the art. Appropriate software coding can readily be prepared by persons skilled in the art based on the teachings of the present disclosure, as will be apparent to those of ordinary skill.

Such software may be a computer program product that employs a machine-readable medium. A machine-readable medium may be any medium that is capable of storing and/or encoding a sequence of instructions for execution by a machine (e.g., a computing device) and that causes the machine to perform any one of the methodologies and/or embodiments described herein. Examples of a machine-readable medium include, but are not limited to, a magnetic disk (e.g., a conventional floppy disk, a hard drive disk), an optical disk (e.g., a compact disk "CD", such as a readable, writeable, and/or re-writable CD; a digital video disk "DVD", such as a readable, writeable, and/or rewritable DVD), a magneto-optical disk, a read-only memory "ROM" device, a random access memory "RAM" device, a magnetic card, an optical card, a solid-state memory device (e.g., a flash memory), an EPROM, an EEPROM, and any combinations thereof. A machine-readable medium, as used herein, is intended to include a single medium as well as the possibility of including a collection of physically separate media, such as, for example, a collection of compact disks or one or more hard disk drives in combination with a computer memory.

Figure 4:
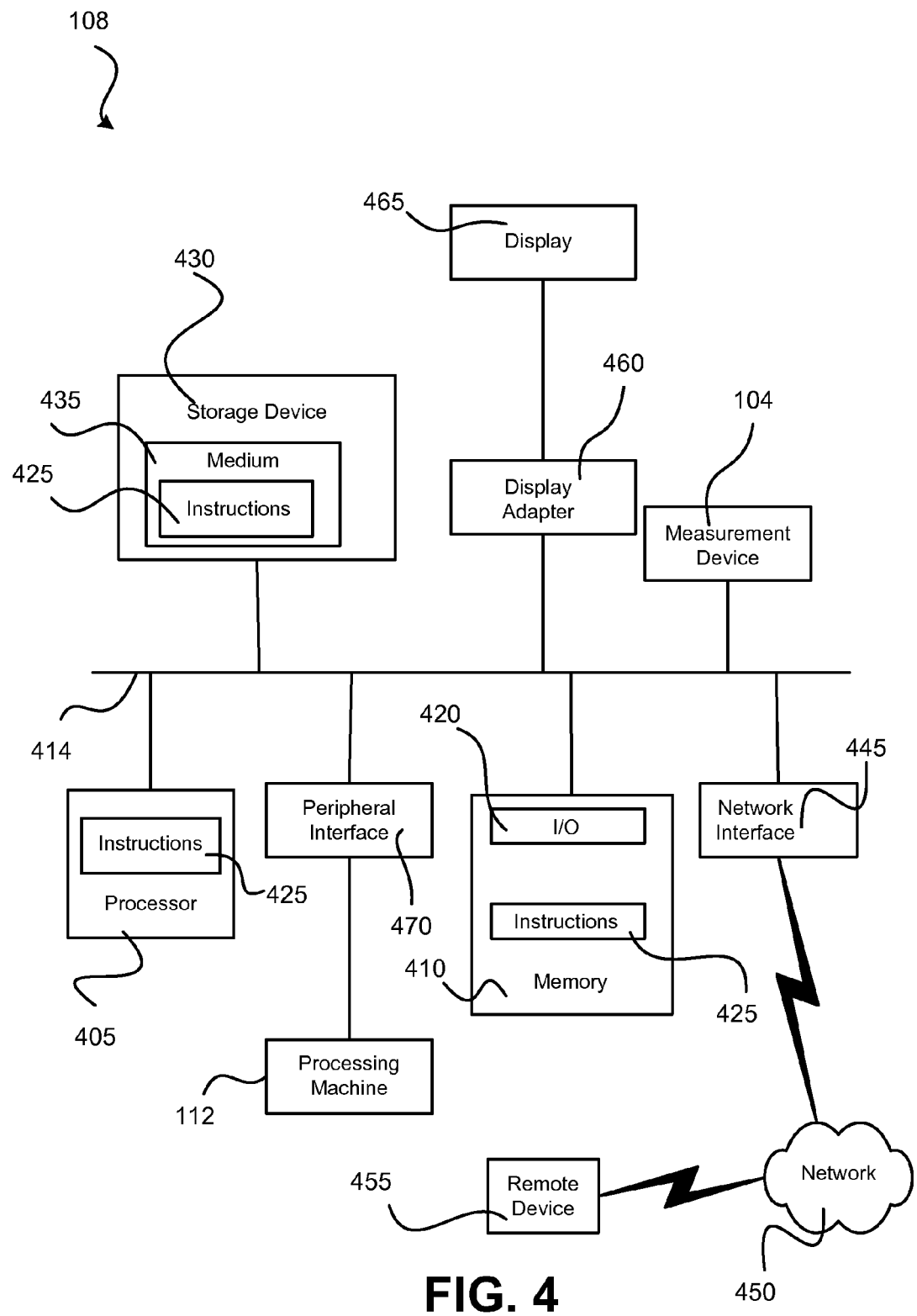
FIG. 4 is a block diagram representation of a computing environment according to an embodiment of the present invention.

FIG. 4 shows a diagrammatic representation of one implementation of a machine/computing device in the exemplary form of a control system 108 within which a set of instructions for causing the device to perform any one or more of the aspects and/or methodologies of the present disclosure may be executed. Control system 108 includes a processor 405 and a memory 410 that communicate with each other, and with other components, such as measurement device 104 and processing machine 112 via a bus 414. Bus 414 may include any of several types of communication structures including, but not limited to, a memory bus, a memory controller, a peripheral bus, a local bus, and any combinations thereof, using any of a variety of architectures.

Memory 410 may include various components (e.g., machine readable media) including, but not limited to, a random access memory component (e.g, a static RAM "SRAM", a dynamic RAM "DRAM", etc.), a read only component, and any combinations thereof. In one example, a basic input/output system 420 (BIOS), including basic routines that help to transfer information between elements within control system 108, such as during start-up, may be stored in memory 410. Memory 410 may also include (e.g., stored on one or more machine-readable media) instructions (e.g., software) 425 embodying any one or more of the aspects and/or methodologies of the present disclosure. In another example, memory 410 may further include any number of program modules including, but not limited to, an operating system, one or more application programs, other program modules, program data, and any combinations thereof.

Control system 108 may also include a storage device 430. Examples of a storage device (e.g., storage device 430) include, but are not limited to, a hard disk drive for reading from and/or writing to a hard disk, a magnetic disk drive for reading from and/or writing to a removable magnetic disk, an optical disk drive for reading from and/or writing to an optical media (e.g., a CD, a DVD, etc.), a solid-state memory device, and any combinations thereof. Storage device 430 may be connected to bus 414 by an appropriate interface (not shown). Example interfaces include, but are not limited to, SCSI, advanced technology attachment (ATA), serial ATA, universal serial bus (USB), IEEE 1395 (FIREWIRE), and any combinations thereof. In one example, storage device 430 may be removably interfaced with control system 108 (e.g., via an external port connector (not shown)). Particularly, storage device 430 and an associated machine-readable medium 435 may provide nonvolatile and/or volatile storage of machine-readable instructions, data structures, program modules, and/or other data for control system 108. In one example, instructions 425 may reside, completely or partially, within machine-readable medium 435. In another example, instructions 425 may reside, completely or partially, within processor 405.

Control system 108 may also include a connection to measurement device 104. Measurement device 104 may be interfaced to bus 414 via any of a variety of interfaces (not shown) including, but not limited to, a serial interface, a parallel interface, a game port, a USB interface, a FIREWIRE interface, a direct connection to bus 414, and any combinations thereof. Alternatively, in one example, a user of control system 108 may enter commands and/or other information into control system 108 via an input device (not shown). Examples of an input device include, but are not limited to, an alphanumeric input device (e.g., a keyboard), a pointing device, a joystick, a gamepad, an audio input device (e.g., a microphone, a voice response system, etc.), a cursor control device (e.g., a mouse), a touchpad, an optical scanner, a video capture device (e.g., a still camera, a video camera), touchscreen, and any combinations thereof.

A user may also input commands and/or other information to control system 108 via storage device 430 (e.g., a removable disk drive, a flash drive, etc.) and/or a network interface device 445. A network interface device, such as network interface device 445 may be utilized for connecting control system 108 to one or more of a variety of networks, such as network 450, and one or more remote devices 455 connected thereto. Examples of a network interface device include, but are not limited to, a network interface card, a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a direct connection between two computing devices, and any combinations thereof. A network, such as network 450, may employ a wired and/or a wireless mode of communication. In general, any network topology may be used. Information (e.g., data, instructions 425, etc.) may be communicated to and/or from control system 108 via network interface device 455.

Control system 108 may further include a video display adapter 460 for communicating a displayable image to a display device 465, such as display device 220. Examples of a display device 465 include, but are not limited to, a liquid crystal display (LCD), a cathode ray tube (CRT), a plasma display, and any combinations thereof.

In addition to display device 465, control system 108 may include a connection to processing machine 112 or one or more other peripheral output devices including, but not limited to, an audio speaker, a printer, and any combinations thereof. Processing machine 112 or other peripheral output devices may be connected to bus 414 via a peripheral interface 470. Examples of a peripheral interface include, but are not limited to, a serial port, a USB connection, a FIREWIRE connection, a parallel connection, a wireless connection, and any combinations thereof.

A digitizer (not shown) and an accompanying pen/stylus, if needed, may be included in order to digitally capture freehand input. A pen digitizer may be separately configured or coextensive with a display area of display device 465. Accordingly, a digitizer may be integrated with display device 465, or may exist as a separate device overlaying or otherwise appended to display device 465.

Figure 5:
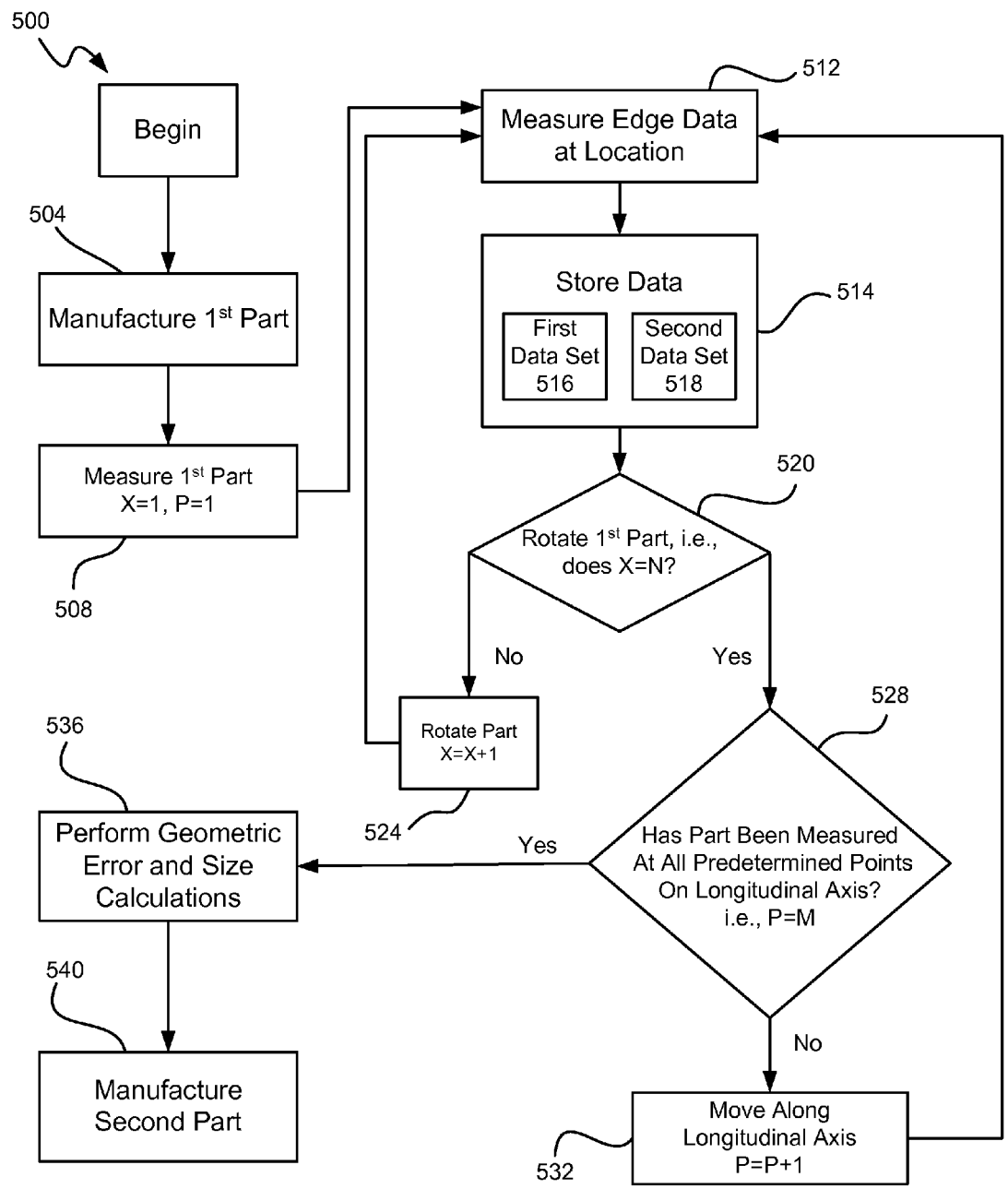
FIG. 5 is a flow diagram illustrating a method of machining low clearance mating parts according to an embodiment of the present invention.

Turning now to an exemplary operation of mating system 100 and with reference to exemplary embodiments shown in FIGS. 2 and 3 and in addition with reference to FIG. 5, first part 116 is typically manufactured at the beginning of a measurement process 500 to a predetermined tolerance at step 504. Typically, the acceptable tolerance level of first part 116 would be dependent upon several factors including, but not limited to, the cost of higher tolerance levels, the time required to improve the tolerance levels, and/or if first part 116 would receive any further treatments, e.g., anodizing. In an exemplary embodiment, first part 116 is manufactured to a fairly wide tolerance level, e.g., a level of about +/−0.002 inches. Optionally, first part 116 may be coated, e.g., anodized (either Type II or Type III), after manufacture with a material designed to modify the properties of the first part. Typically, such coating will harden the outer surface of first part 116, although other surface modifications are encompassed by the present invention.

First part 116 is then measured by measuring device 104 at step 508. As shown in FIG. 5, measurement of first part 116 begins at a first position, i.e., X=1, and at a first cross-sectional plane, i.e., P=1. As discussed more fully below, measurements may be taken around first part 116, i.e., from X=1 to X=N, at multiple planes, i.e., P=1 to P=M, in order to sufficiently characterize the surface features and size of the first part.

Typically, first part 116 is secured to measuring device 104 via chuck 212. As will be described more fully below, it may be advantageous to secure first part 116 into chuck 212 in such a way so as to induce position errors. This may be achieved by either manual positioning of first part 116 in an off-center, tilted position, by designing chuck 212 so that first part 116 will be in an off-center, tilted position when secured into chuck 212, or by other means known by a person of ordinary skill in the art.

Figure 7:
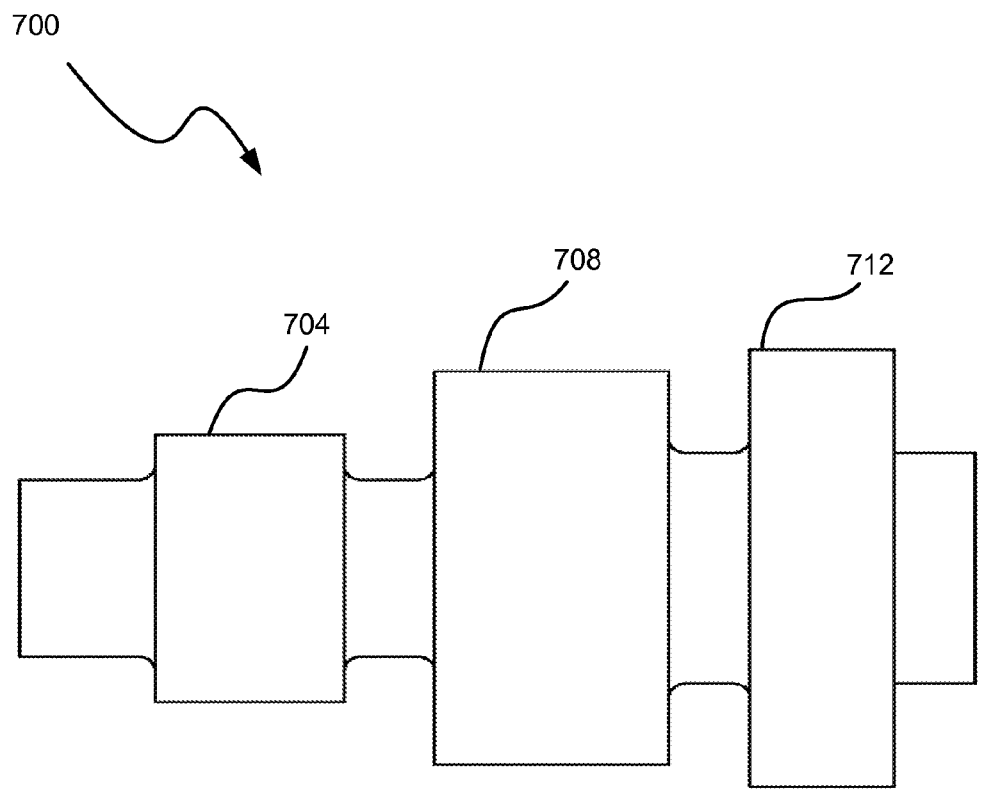
FIG. 7 is a side view of a first part having multiple diameters according to an embodiment of the present invention.

Once secured, a plurality of parameters, e.g., the edge data of first part 116, are measured by measuring device 104 at step 512. Parameters determined by non-contact micrometer 216 may be stored in storage device 430 by control system 108 as two or more data sets at step 514. In an exemplary embodiment, first data set 516 may represent the distance between an edge of first part 116 and a reference point in the cross-section or plane of measurement, typically inside the boundaries of first part, that is substantially orthogonal to the longitudinal axis of the first part so as to generate edge datum, i.e., a theoretical radius of the first part. Second data set 518 may represent the distance between the opposed edges of first part 116, i.e., the diameter of the first part at the point of measurement. Additional data sets may be included for other features of first part 116 or to segment of the first part. For example, if first part 116 is a spool valve with three concentric lands of different diameters, (as shown in FIG. 7 (described below), lands 704, 708, and 712), data sets may be devised such that edge data sets, both first and second data sets 516, 518, respectively, as previously described, are determined for each land. In any event, measuring device 104 is not intended to be limited by delineation of data sets as described herein, as data sets may be created as necessary to measure the appropriate features of first part 116.

Control system 108 then determines whether first part 116 should be rotated at step 520 by evaluating whether the first part has been measured at all the predefined places around the circumference of the part in a given plane of measurement. If first part 116 has not been measured at all predefined places and so should be rotated further, the method proceeds to step 524 where control system 108 instructs rotary table 208 to rotate first part 116. Once rotated, non-contact micrometer 216 determines the edge data of first part 116, which is then stored by control system 108 in for example, storage device 430. In an exemplary embodiment, control system 108 instructs rotary table 208 to continuously rotate first part 116 and to enable to the capture of edge data each time rotary table 208 has moved approximately 10 degrees, thus enabling the capture of edge data at thirty-six locations around circumference of first part 116. In an alternative embodiment, control system 108 instructs rotary table 208 to rotate first part 116 in 10 degree increments within a given plane of measurement and rotates the part a total of thirty-five times, thus also enabling the capture of edge data at thirty-six locations around circumference of first part 116.

First part 116 may be rotated more or less than about thirty-five times depending on the degree of accuracy sought regarding the surface characteristics of first part 116. Typically, the number of measurements may also be limited by time allotted for measuring. The degree of accuracy obtained per unit time can be referred to as the characterization efficiency, which represents the number of measurements per unit time to achieve a clearance tolerance level corresponding to a certain length of first part 116. When maximized, this parameter generally represents the minimum number of measurements of first part 116 allowable to achieve a minimal clearance tolerance range and meet processing time requirements. In an exemplary embodiment, measurement device 104 has a characterization efficiency upper limit of about 72. In a further refined embodiment, the characterization efficiency has a value of about 36, although depending upon design parameters in particular applications a characterization efficiency of between about 18 to 54 may be found useful.

It is also understood that there is some redundancy in rotating first part 116 thirty-five times given that non-contact micrometer 216 takes edge data at opposed locations. This redundancy may be necessary to ensure consistent measurement of the radius of first part 116 as the reference point in the cross-section or plane of measurement that is substantially orthogonal to the longitudinal axis that includes the edge datum may not be the actual center of the cross-section or plane. This redundancy may also be used to correct for errors in second data set 518. For example, if the diameter of first part 116 is measured twice per revolution the diameter should be the same when measured at 10° and 190°. If these measurements do not match, the data can be corrected or first part 116 can be remeasured.

If control system 108 determines that first part 116 should no longer be rotated within the current plane of measurement (e.g., first part 116 has been rotated thirty-five times, equals a predefined specification, or if upon assessing the predefined increment, control system 108 calculates that the part has been rotated 360 degrees), control system 108 then resolves whether linear slide 204 should move non-contact micrometer 216 to another plane along the longitudinal axis of first part 116 at step 528. In an exemplary embodiment, measurement device 104 repeats steps 512, 516, 520, and 524 along the longitudinal axis of first part 116 at any desired increment, for instance, each 0.1 inch. In alternative embodiments, measurement device 104 may measure at larger or smaller increments depending upon the accuracy required for machining second part 120 and the dimensions of first part 116. For example, if first part 116 is a valve spool with multiple lands having concentric diameters as seen in FIG. 7, measurement device 104 may not necessarily measure the space between the lands, e.g., between first land 704 and second land 708, as this may not have an impact on the instructions to processing machine 112.

If no further movement along the longitudinal axis of first part 116 is necessary, for example, the number of increments previously measured equals a predefined specification or if upon assessing the predefined increment, control system 108 determines, based on the total length of the first part, that the part has measured the length of the first part, the control system, via processor 405, a program module in storage device 430, or other means known in the art, initiates an error and size determination, at step 536, calculating the geometric errors and size associated with first part 116. An exemplary embodiment of an error and size determination process 536 is diagramed below in connection with FIG. 6.

At step 604 of process step 536, control system 108 may retrieve stored first data set 516 from storage device 430 or other storage location in control system 108. Error and size determination process 536 then may begin the process of determining the roundness of first part 116 at a given plane using first data set 516.

In some cases, artifacts may exist in the data in first data set 516. If artifacts exist in first data set 516 and are to be removed before the roundness of first part 116 is determined, the first step may be to eliminate artifacts from the first data set. Artifacts may be microscopic dust, debris, or other removable particles of matter that obscure the feature being measured, e.g., the edge or diameter of first part 116. These artifacts may affect the measurements taken by measurement device 104 by increasing the value of measurement, e.g., a larger diameter or radius is measured at a given point of measurement, and in some cases may need to be removed in order to more accurately ascertain the surface characteristics of first part 116. Artifacts may be removed in a process which generally includes removing outliers in both the positive and negative directions that exceed a certain amount and/or removing outliers that exceed excursions of a certain, predefined amount. In an exemplary embodiment, artifacts are identified by reviewing the measured data as a sequence and noting deviant data points that diverge significantly from the data point before and after the deviant data point. The deviant data points may then be altered or corrected by various methods, including, but not limited to, remeasuring first part 116 or approximating a value for the deviant data point that may more closely represent the true value.

A second error removal step may be the removal of position error, i.e., offset of the center of first part 116 from the axis of rotation of measurement device 104, at step 612. Position error may caused by the general imprecision that comes with mounting first part 116 into chuck 212 or it may be purposefully induced. Although it is theoretically possible to position first part 116 so that the first part's axis of rotation is centered in measurement device 104, there are methodologies that exist in the art to remove errors that may come from improper mounting. In fact, it may be advantageous to induce position error either through manual, mechanical, or other means in order to make the position error easier to identify and to make the measurement process quicker and less costly, e.g., less time is taken to align the part and special tools are unnecessary to ensure positioning. In an exemplary embodiment, position error is removed from first data set 516 by identifying a 1 Hz harmonic in the first data set, including its phase angle, amplitude, and offset and then subtracting the amplitude value of the harmonic at the appropriate phase angles. The correlation between a pure first order harmonic and the harmonic identified in first data set 516 may be used as a guide as to when the phase angle, amplitude, and offset have been sufficiently delineated. In an exemplary embodiment, the correlation between the pure harmonic and the harmonic identified in first data set 516 is greater than 95%. Greater or less correlation between the pure harmonic and the harmonic identified in first data set 516 may be desirable when it is desired that the mating parts have consistently improved or lower quality clearances, respectively.

A third error removal step may include the removal of Abbé error, e.g., chucking tilt angle of first part 116, at step 616. Abbé error is generally the linear positional error caused by the combination of the axes of measurement being offset from the plane of motion and an angular error in that motion. Abbé error may be calculated by methods readily known in the art, which may include comparing the data taken at two different planes along first part 116. In an exemplary embodiment, Abbé error is calculated after the removal of the first order harmonic, i.e., step 612. As mentioned previously with regards to position error, it may be advantageous to induce Abbé error while securing first part 116 to chuck 212 in order to more easily identify the error and to lower operational costs.

A fourth error removal step may include the removal of tilt error resulting from the mispositioning of first part 116 in chuck 212. Although it is theoretically possible to position first part 116 so that it is perfectly perpendicularly placed in measurement device 104, there are methodologies that exist in the art to remove errors that may come from improper mounting. As with position error and Abbé error it may be advantageous to induce the error, in this case tilt error, either through manual, mechanical, or other means in order to make the tilt error easier to identify and to make the measurement process quicker and less costly, e.g., less time is take to align the part and special tools are unnecessary to ensure proper positioning. The process for removing tilt error is generally the same as that for removing position error except that instead of identifying a first order harmonic, first data set 516 is evaluated for a second order harmonic. In an exemplary embodiment, tilt error is removed from first data set 516 by identifying a 2 Hz harmonic in the first data set, including its phase angle, amplitude, and offset and then subtracting the amplitude value of the harmonic at the appropriate phase angles. The correlation between a pure second order harmonic and the harmonic identified in first data set 516 may be used as a guide as to when the phase angle, amplitude, and offset have been sufficiently delineated. In an exemplary embodiment, the correlation between the pure harmonic and the harmonic identified in first data set 516 is greater than 95%. Greater or less correlation between the pure harmonic and the harmonic identified in first data set 516 may be desirable when it is desired that the mating parts have consistently improved or lower quality clearances, respectively.

As shown by exemplary process 600, after the removal of errors from first data set 516, several geometric errors may be calculated. For example, roundness error of first part 116 may be determined step 624. Generally, roundness error is considered the difference between the actual surface of first part 116 and a circle having a constant radius. There are several methodologies used for determining roundness error known in the art. Several methods are described in ANSI B 89.3.1: 1972 *Measurement of Out-of-Roundness*, which is incorporated herein by reference in its entirety. In an exemplary embodiment of process 600, roundness error is calculated using the least squares circle method (LSC). The LSC generates a reference circle sized so that the sum of the area between the circle and the surface of first part 116 inside the circle equals the sum of the area between the circle and the surface of first part 116 outside the circle. The roundness error then can be determined as the difference between the maximum and minimum distance from this reference circle, i.e., the difference between the shortest and longest radius from the center of the reference circle. Once roundness error is calculated at a given plane, the process proceeds to step 628 at which point the determination is made whether or not the process has determined roundness error at all the planes of first part 116 included in first data set 516. If not, the process returns to step 608 so that the roundness error at the remaining planes along first part 116 may be determined. It would be readily apparent to a person skilled in the art that other methods exist by which to determine roundness error, some of which are described in ANSI B 89.3.1: 1972, which is referenced above.

Figure 6:
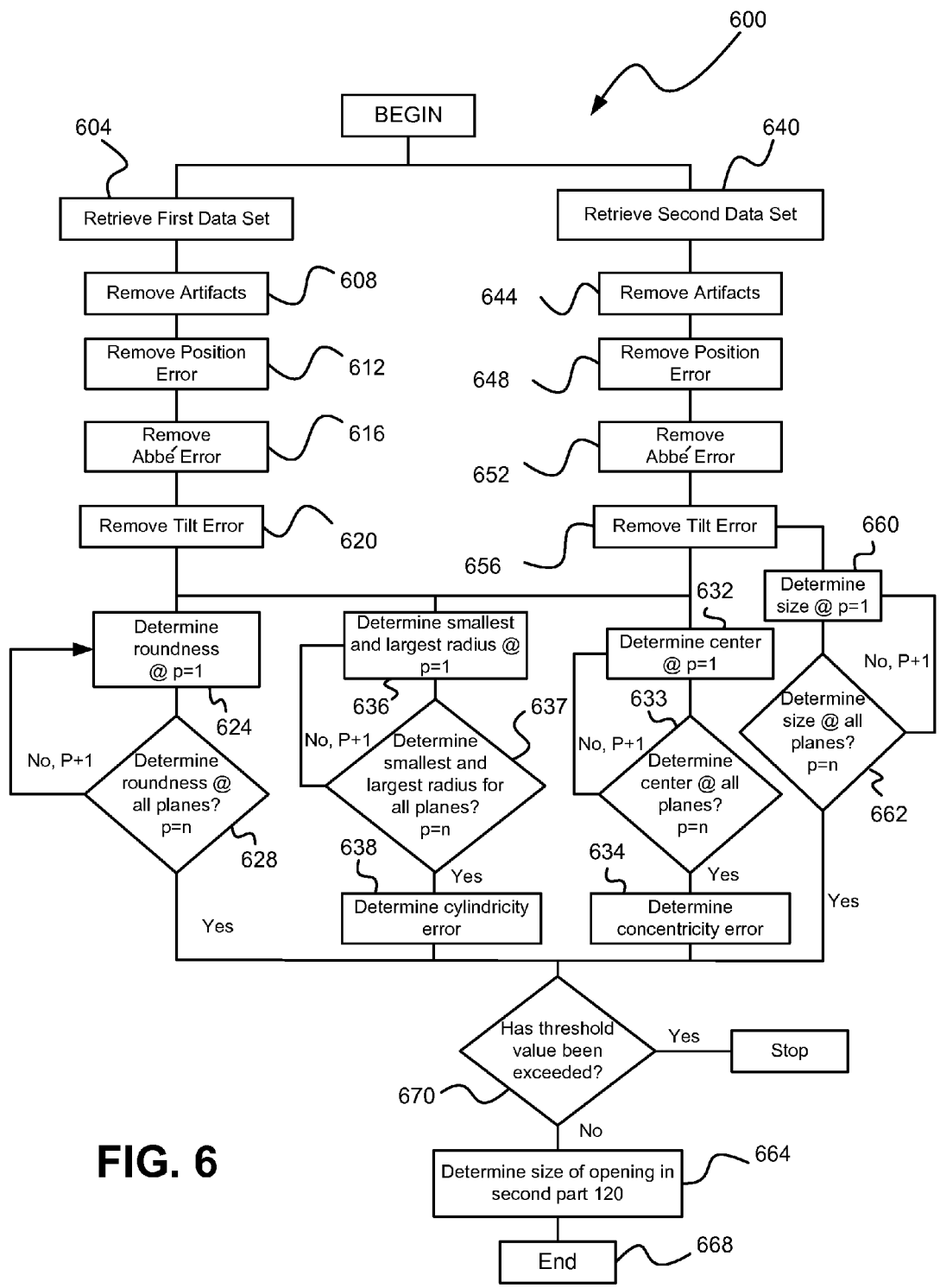
FIG. 6 is a flow diagram for a size and geometric error calculator method according to an embodiment of the present invention.

In some applications it may be desired that concentricity error also be determined using first data set 516, at step 634. Concentricity error is generally considered the condition in which all the cross-sectional elements of a cylinder or cylinders have common axes. In an exemplary embodiment of process 600, when first part 116 is generally cylindrical, each respective center of the substantially circular planes previously measured by measurement device 104, as shown in steps 632 and 633, may be determined from first data set 516. The center of each plane may be determined by correcting for position and tilt as described previously. The concentricity error may then be determined at step 634 by assessing the variation in the location of the centers along the longitudinal axis of first part 116. Notably, although concentricity error may be determined using first data set 516, as will be discussed further below, it may be preferable to use second data set 518. As illustrated in FIG. 6, concentricity error of first part 116 is determined in parallel with determining the roundness of the first part at steps 624 and 628 and cylindricity error at steps 636, 637, and 638 of the first part. Alternatively, concentricity error may be determined before or after roundness error and/or cylindricity error are determined.

Another geometric error that may be determined, if desired, is cylindricity error at step 636. Cylindricity error is typically considered the three-dimensional geometric difference between the cylindricity of an item from a reference cylinder. In an exemplary embodiment, cylindricity error is determined by using an LSC approach, whereby, a reference cylinder is sized so that the sum of the area between the cylinder and the surface of first part 116 inside the cylinder equals the sum of the area between the cylinder and the surface of first part 116 outside the cylinder. The cylindricity error then can be determined as the difference between the maximum and minimum distance from this reference cylinder. As illustrated in FIG. 6, cylindricity error of first part 116 is determined in parallel with determining the roundness error of the first part at steps 624 and 628 and concentricity error of the first part at steps 634, 633, and 634. Alternatively, cylindricity error may be determined before or after roundness error and/or concentricity error are determined.

Process 600 may also include error removal and analysis of second data set 518, beginning at step 640. In this regard, process 600 removes the various errors and imperfections previously described, e.g., artifacts (step 644), position error (step 648), Abbé error (step 652), and tilt error (step 656). After the desired errors and artifacts are removed, geometric errors may be determined from second data set 518 in a similar manner as previously described or via other methodologies recognizable to those skilled in the art. In addition, the size of first part 116 may be determined at step 660. In an exemplary embodiment, the size of first part 116 would be determined by finding the minimum circumscribed circle (MCC), as defined in ANSI B 89.3.1: 1972 *Measurement of Out-of-Roundness*, which is incorporated herein by reference in its entirety, at each plane of first part 116. The MCC is determined, in one exemplary embodiment, by iteratively adjusting the center at a plane of first part 116 so that a circle can be determined that is the smallest circle that encapsulates the entire surface of first part 116. This process is repeated at all planes, i.e., step 662, for which data was taken in measurement process 500. The largest MCC determined from an analysis of all planes indicates the minimum opening in second part 120 that would allow entry by first part 116.

In an exemplary embodiment of process 600, process 600 may additionally include a threshold exceed step 670, which determines whether any of the aforementioned errors, i.e., roundness, concentricity, or cylindricity, if determined, exceed a corresponding predetermined threshold error value. If one or more of the errors exceed a corresponding predetermined threshold value, the process does not proceed to step 664. Instead, the process ends. If, however, none of the errors exceed a corresponding predetermined threshold value, the process continues to step 664, where the size of the opening in second part 120 is determined.

In an alternative embodiment of process 600, process 600 may be configured to assess a first part with multiple features, e.g., multiple design diameters, as shown in FIG. 7. FIG. 7 shows a first part 116 with a first diameter 704, a second diameter 708, and a third diameter 712. In order to make a low clearance matching set between first part 116 and second part 120, process 600 may be designed to conduct the aforementioned steps on first diameter 704, second diameter 708, and third diameter 712. For instance, after measurement apparatus has measured first part 116 at all desired planes and at all desired locations around the first part, process 600 may determine the size and geometric errors for first diameter 704, then may determine the size and geometric errors for second diameter 708, and then may determine the size and geometric errors for third diameter 712. The size and geometric errors may be determined by the methods previously described or by other means known in the art. The geometric errors may be compared against corresponding predetermined threshold values and if not exceeded, may be used to determine the size of the opening in second part 120 for each of the aforementioned diameters.

Concentricity error may also be determined at step 634 from the results of the MCC analysis. As the MCC analysis results in a circle being defined at each plane of data on first part 116, the centers of each of these circles can be compared for variability along the axis resulting in a concentricity error determination.

Notably, the size of first part 116 as determined by the process described above may need to take into consideration other geometric errors, such as cylindricity error, at step 664. For example, if first part 116 is shaped like a banana, the largest MCC may be smaller than necessary for first part 116 to slide into second part 120. Cylindricity error may be combined with the size determination to adjust the "effective size" of first part 116, that is, the smallest size of first part 116 that will fit into second part 120.

With the calculation of the size and geometric errors of first part 116 completed, the manufacture of second part 120 may be performed. Typically, control system 108 develops a set of instructions for processing machine 112, which are derived from process 600 that describes the dimensions of second part 120. As a final optional step, a clearance amount that adds additional space between the surfaces of first part 116 and second part 120 may be included in the determination of the necessary opening size of second part 120. A clearance amount may be added to allow for easier mating of the two parts. In an exemplary embodiment, generally, the opening in second part 120 is enlarged by a small value, typically about 0.00005 inch. Any such increase in the opening size of second part 120 will vary as a function of the context in which the first part 116 and second part 120 will be used, desired ease of mating of the two parts, and other factors.

Referring again to FIG. 5, and specifically to step 540, the manufacture of second part 120 takes place on processing machine 112. Second part 120 is precisely hollowed out according to the instructions of control system 108 by, for example, removal tool 308. Hole enlarger is moved by lateral slides 316A-B and second part 120 is rotated by spindle 306, thus in combination, the movements allow for removal of material around the entire inner circumference of the opening of second part 120 and along the longitudinal axis of second part 120. In an exemplary embodiment, removal tool 308 is capable of movement in two directions in the coordinate plane. However, in alternative embodiments processing machine 112 may be designed and configured so that removal tool 308 is capable of movement in all three directions of the coordinate plane such that various shapes may be hollowed out of second part 120.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A measurement device that coincidentally determines the size and geometric errors of a first part for mating parts, wherein the first part has a specified manufacturing tolerance range, comprising:
    a base;
    a holding device for the first part disposed on said base;
    at least one non-contact micrometer disposed on said base cooperating with the holding device to coincidentally indicate opposing plural edges of the first part at a plane substantially orthogonal to a longitudinal axis of the first part, said non-contact micrometer being configured to acquire
        a first data set representing a first parameter of the first part, said first data set comprising a distance between one of said opposing plural edges and a reference point;
        a second data set representing a second parameter of the first part, said second data set comprising a distance between said opposing plural edges; and
    a control system in communication with said at least one non-contact micrometer receiving said first data set and said second data set, and wherein said control system determines at least one dimension of and at least one geometric error representative of the shape of the first part from at least one of said first data set and said second data set.

2. The measurement device according to claim 1, wherein said measurement device further comprises a rotational movement device disposed in between said holding device and said base.

3. The measurement device according to claim 1, wherein said measurement device further comprises:
    a rotational movement device, wherein said holding device is disposed thereon and wherein said rotational movement device is capable of rotating the first part; and
    a linear incremental movement device, wherein said non-contact micrometer is disposed thereon and said linear incremental movement device is capable of moving said non-contact micrometer along the longitudinal axis of the first part.

4. The measurement device according to claim 3, wherein said linear incremental movement device moves at increments of at least about 0.1 inch.

5. The measurement device according to claim 1, wherein said measurement device further comprises a rotational movement device disposed in between said non-contact micrometer and said base.

6. The measurement device according to claim 5, wherein said measurement device further comprises a linear incremental movement device disposed in between said holding device and said base.

7. The measurement device according to claim 1, wherein said measurement device further comprises a movement device capable of rotational and linear movements, wherein said movement device is disposed between said holding device and said base.

8. The measurement device according to claim 1, wherein said measurement device further comprises a movement device capable of rotational and linear movements, wherein said movement device is disposed between said non-contact micrometer and said base.

9. The measurement device according to claim 1, wherein said control system comprises at least a processor and a memory, and said memory contains a set of instructions executable by said processor, said set of instructions including:
  identifying a 1 Hz harmonic having a phase angle, an amplitude, and an offset that corresponds to said position error in at least one of said first data set and/or said second data set; and
  subtracting the amplitude value of said 1 Hz harmonic from at least one of said first data set and/or said second data set at the appropriate phase angles.

10. The measurement device according to claim 1, wherein said control system comprises at least a processor and a memory, and said memory contains a set of instructions executable by said processor, said set of instructions including:
  identifying a 2 Hz harmonic having a phase angle, an amplitude, and an offset that corresponds to said tilt error in at least one of said first data set and/or said second data set; and
  subtracting said amplitude value of said 2 Hz harmonic from at least one of said first data set and/or said second data set at the appropriate phase angles.

11. The measurement device according to claim 1, wherein said measurement device has a characterization efficiency of less than about 72.

12. The measurement device according to claim 1, wherein said measurement device includes a plurality of non-contact micrometers.

13. The measurement device according to claim 12, wherein said plurality of non-contact micrometers are positioned at a plurality of points along the longitudinal axis of the first part.

14. The measurement device according to claim 1, wherein said difference is determined at a maximum of about 36 points around the circumference of the first part at a single plane of measurement substantially orthogonal to the longitudinal axis of the first part.

15. The measurement device according to claim 1, wherein said non-contact micrometer acquires at least a first datum for said first data set and at least a second datum for said second data set in one measurement operation.

16. The measurement device according to claim 1, wherein said a distance between one of said opposing plural edges and a reference point is a radius and wherein said a distance between said opposing plural edges is a diameter.

17. The measurement device according to claim 1, wherein said holding device preserves a tilt error and a position error that is induced when mounting the first part in said holding device.

18. The measurement device according to claim 1, wherein said measurement device completes the measurement of the first part in less than about 2 minutes and wherein a second part, when slidingly engaged with the first part, has a clearance tolerance of less than about 0.00005 inches.

19. The measurement device according to claim 1, wherein the first part has plural lands each having a respective design diameter, and wherein said first data set represents at least a first parameter of each of said plural lands, and said second data set represents at least second parameter of each of said plural lands.

20. The measurement device according to claim 19, wherein said measurement device completes the measurement of the first part in less than about 2 minutes and wherein a second part, when slidingly engaged with the first part, has a clearance tolerance of less than about 0.00005 inches at each of said plural lands.

21. A measurement system that coincidentally determines the size and geometric errors of a first part that mates with a second part, wherein at least the first part has a specified manufacturing tolerance range and at least the second part mates slidably with the first part, the system comprising:
  a metrology device suitable for coincidentally measuring at least a first and second parameter of the first part, said first parameter contributing to a first data set comprising at least a plurality of distances between a reference point and the surface of the first part and said second parameter contributing to a second data set comprising at least a plurality of distances between opposing points on the surface of the first part;
  a control system programmed to accept said first data set and said second data set, said control system having means to determine the size and geometric error associated with the first part from said second data set and said first data set, respectively; and
  a processing machine for processing the second part based upon the combined size and geometric error determined by said control system.

22. The system according to claim 21, wherein said means to determine the size and geometric error of the first part comprises:
  a memory containing a set of instructions, wherein said set of instructions includes:
    identifying a first harmonic variation that represents a positional error in at least one of said first data set and/or said second data set, wherein said first harmonic variation has an amplitude and a frequency that corresponds with a sine wave;
    subtracting said sine wave from at least one of said first data set and/or said second data set; and
  a processor programmed to execute said set of instructions.

23. The system according to claim 21, wherein said means to determine the size and geometric error of the first part comprises:
  a memory containing a set of instructions, wherein said set of instructions includes:
    identifying a second harmonic variation that represents tilt error in at least one of said first data set and/or said second data set, wherein said second harmonic variation has an amplitude and a frequency that corresponds with a cosine wave; and subtracting said cosine wave from in at least one of said first data set and/or said second data set; and a processor programmed to execute said set of instructions.

24. The system according to claim 21, wherein said metrology device comprises an optical micrometer.

25. The system according to claim 21, wherein said metrology device collects said first parameter and second parameter at about consecutive 10 degree increments around the first part.

26. The system according to claim 21, said process machine further comprising:

a rotary table including a holding device;

a removal tool coupleable with a plurality of lateral slides;

a boring bar, wherein said removal tool is disposed thereon; and a centering probe coupleable with said boring bar.

27. The system according to claim 21, wherein said plurality of distances between a reference point and the surface of the first part are a plurality of radii and wherein said plurality of distances between opposing points on the surface of the first part are a plurality of diameters.

28. A system according to claim 21, wherein said metrology device measures the first part and said processing machine processes the second part in less than about 9 minutes.

29. A system according to claim 28, wherein the second part, when slidingly engaged with the first part, has a clearance tolerance of less than about 0.00005 inches.

30. A system according to claim 21, wherein said metrology device measures the first part and said processing machine processes the second part in less than about 2 minutes.

31. A system according to claim 30, wherein the second part, when slidingly engaged with the first part, has a clearance of less than about 0.00005 inches.

* * * * *